(12) United States Patent
Hashimoto et al.

(10) Patent No.: US 8,454,068 B2
(45) Date of Patent: Jun. 4, 2013

(54) EDGE GRIP DEVICE AND ROBOT INCLUDING THE SAME

(75) Inventors: Yasuhiko Hashimoto, Kobe (JP); Toshiaki Yoshida, Kobe (JP)

(73) Assignee: Kawasaki Jukogyo Kabushiki Kaisha, Kobe-shi (JP)

( * ) Notice: Subject to any disclaimer, the term of this patent is extended or adjusted under 35 U.S.C. 154(b) by 223 days.

(21) Appl. No.: 12/951,356

(22) Filed: Nov. 22, 2010

(65) Prior Publication Data

US 2011/0187140 A1 Aug. 4, 2011

(30) Foreign Application Priority Data

Dec. 1, 2009 (JP) ................................. 2009-273586

(51) Int. Cl.
*B25J 15/00* (2006.01)

(52) U.S. Cl.
USPC ........ 294/103.1; 294/213; 294/902; 414/941; 901/39

(58) Field of Classification Search
USPC ............ 294/103.1, 902, 119.1, 213; 414/936, 414/941, 744.2, 222.01, 752.1, 744.8; 118/728; 901/31, 39
See application file for complete search history.

(56) References Cited

U.S. PATENT DOCUMENTS

| | | | |
|---|---|---|---|
| 6,216,883 B1 * | 4/2001 | Kobayashi et al. | 211/41.18 |
| 7,186,297 B2 * | 3/2007 | Asano | 118/728 |
| 7,611,182 B2 * | 11/2009 | Kim et al. | 294/103.1 |
| 7,644,968 B2 * | 1/2010 | Hirooka et al. | 294/103.1 |

FOREIGN PATENT DOCUMENTS

| | | |
|---|---|---|
| JP | A-2002-134586 | 5/2002 |
| KR | 1999-007081 A | 1/1999 |

OTHER PUBLICATIONS

Aug. 21, 2012 Office Action issued in Korean Patent Application No. 10-2010-0121143.

* cited by examiner

*Primary Examiner* — Paul T Chin
(74) *Attorney, Agent, or Firm* — Oliff & Berridge, PLC

(57) ABSTRACT

A chuck hand 1 includes a pressing mechanism 14 having a pusher 25 which presses a semiconductor process wafer 3 in the direction of a front guide 12 to thereby grip the semiconductor process wafer 3. The pressing mechanism 14 further has a pusher supporting body 22 and a buffering member 28. The pusher supporting body 22 is configured such that it can advance and retract. The pusher supporting body 22 is disposed in the pusher 25 such that it can slide back and forth. A gap 26a is defined forward relative to the pusher supporting body 22. The buffering member 28, which has a low bounce and is elastically deformable, is interposingly placed in the gap 26a. When the pusher supporting body 22 moves forward, it pushes the pusher 25 through the buffering member 28 whereby the pusher 25 is moved forward. The pusher 25 is abutted and pressed against the semiconductor process wafer 3.

5 Claims, 5 Drawing Sheets (a)

(b)

EDGE GRIP DEVICE AND ROBOT INCLUDING THE SAME

TECHNICAL FIELD

The present invention relates to an edge grip device for gripping a semiconductor process wafer such as a semiconductor wafer, a glass substrate, or the like and further relates to a robot including such an edge grip device.

BACKGROUND ART

A transfer robot for transporting a substrate such as a semiconductor wafer, a glass substrate, or the like has at its distal end an end effector (for example, a hand). The transfer robot is configured such that it holds and transports a substrate using the hand. As an example of the hand for holding a substrate, there can be cited a hand which is configured to hold a substrate by applying suction to an underside of the substrate. In such a type of hand, however, particles may adhere to the substrate's underside at the time of suction. The adhering of particles to a substrate is objectionable. It is therefore preferable to hold a substrate using a different technique preventing adhesion of particles. As a method preventing adhesion of particles, there can be cited a technique of gripping a substrate. As a hand capable of implementing such a technique, there can be cited a blade as set forth, for example, in Patent Literature 1.

The blade as set forth in Japanese Laid-Open Patent Application Publication No. 2002-134586 is formed into a Y-shape and has a joint to which an arm of a robot is coupled. A mounting wing is attached to the joint such that it extends from the joint. The mounting wing is formed such that it is bifurcated on its end side into two ends and there is formed at each end a fixing fin.

In addition, the joint is provided with a clamping member for clamping a substrate on the mounting wing. The clamping member has a moving pusher and a pneumatic cylinder. The pneumatic cylinder serves to advance and retract the moving pusher. The moving pusher is configured such that its forward movement pushes the substrate on the mounting wing in the direction of the fixing fins to thereby support, along with the fixing fins, the substrate.

The clamping member thus configured further has a spring for shock protection. This shock protection spring is mounted in the moving pusher and serves to reduce the shock imparted from the moving pusher to the substrate upon contact of the moving pusher with the substrate.

The blade as set forth in Japanese Laid-Open Patent Application Publication No. 2002-134586 is configured such that the moving pusher is moved forward by the pneumatic cylinder to abut against the substrate to thereby support it. Therefore, at the time when the moving pusher is brought into abutment with the substrate, a shock is applied to the substrate from the moving pusher. In order to reduce the shock, the moving pusher is provided with the shock protection spring.

In spite of the fact that a shock protection spring can reduce shock, damping characteristic of the spring occurs because of its large bounce. If damping takes place, the pressing-force with which the moving pusher pushes a substrate becomes unstable and the substrate will no longer be held firmly. Therefore, it is not until the damping of the shock protection spring subsides after abutment of the moving pusher with the substrate that the blade is finally allowed to move. This increases the length of time during which the substrate is to be gripped.

SUMMARY OF INVENTION

Accordingly, an object of the present invention is to provide an edge grip device capable of gripping a semiconductor process wafer and thereafter quickly moving it, and to provide a transfer robot including such an edge grip device.

The present invention provides an edge grip device comprising a clamp member and a pressing mechanism, the pressing mechanism including a pusher which is disposed so as to face the clamp member and which presses a semiconductor process wafer against the clamp member to thereby grip, along with the clamp member, the semiconductor process wafer. The pressing mechanism further includes a pusher supporting body which is movable in a direction in which the pressing is applied (hereinafter referred to as the "pressing direction"), which defines a gap with the pusher in the pressing direction and which supports the pusher so that the pusher is relatively movably guided in the pressing direction, and a buffering member which is arranged in the gap between the pusher and the pusher supporting body, the buffering member having a low bounce and being elastically deformable, wherein, when the pusher supporting body moves in the pressing direction, the pusher supporting body pushes the pusher through the buffering member to thereby move the pusher in the pressing direction whereby the semiconductor process wafer is pressed against the clamp member.

According to the present invention, when the pusher supporting body is moved in the pressing direction, the pusher supporting body pushes the pusher. The pusher thus pushed abuts against a semiconductor process wafer and the semiconductor process wafer is pressed against the clamp member. By doing this, the pusher grips, along with the clamp member, the semiconductor process wafer. The pusher gripping the semiconductor process wafer in this way is pushed back against the pusher supporting body at the moment when the pusher abuts against the semiconductor process wafer. And the pusher supporting body makes a relative movement with respect to the pusher to cause the buffering member to undergo an elastic deformation. This elastic deformation of the buffering member reduces the force acting between the pusher supporting body and the pusher, i.e., the force with which the pusher supporting body pushes the pusher. This suppresses the force applied onto the semiconductor process wafer at the moment when the pusher abuts against the semiconductor process wafer, thereby making it possible to cushion the shock occurring to the semiconductor process wafer. This makes it possible to accomplish improvement in yield of the semiconductor process wafer.

The buffering member capable of reducing the shock in the way as above described is able to absorb shock without damping. Therefore, it is possible that, after gripping a semiconductor process wafer, it can be moved quickly without having to wait for damping to subside. Since the semiconductor process wafer, after being gripped, can be moved quickly, this makes it possible to improve the rate of production of the semiconductor process wafer.

In the foregoing invention, it is preferable that the pusher supporting body has a guiding portion by which the pusher is guided movably in a direction opposite to the pressing direction, that the pusher has a guiding groove which fits with the guiding portion in a relatively movable manner in the pressing direction and which is longer than the guiding portion in the pressing direction and that the buffering member is inserted through the guiding groove such that the buffering member is located forward relative to the guiding portion in the pressing direction and undergoes an elastic deformation when relatively pressed by the guiding portion.

According to the above configuration, the buffering member is arranged forward relative to the guiding portion in the pressing direction, thereby suppressing the movement of the guiding portion in the pressing direction with respect to the guiding groove. Therefore, when the pusher supporting body is moved in the pressing direction, the pusher is moved together with the pusher supporting body. Thereafter, when the pusher abuts and stops against the semiconductor process wafer, the guiding portion makes a relative movement in the guiding groove while pressing and causing the buffering member to elastically deform. By making such a relative movement while elastically deforming the buffering member, the force with which the guiding portion pushes the pusher is reduced by the buffering member, that is to say, the force is absorbed. This makes it possible to suppress the force applied onto the semiconductor process wafer at the moment when the pusher abuts against the semiconductor process wafer, thereby making it possible to reduce the shock occurring between the semiconductor process wafer and the pusher. Such reduction in the shock prevents the semiconductor process wafer from damage even if the rate of movement of the pusher supporting body is increased when gripping the semiconductor process wafer. Therefore, it becomes possible to quickly grip the semiconductor process wafer by increasing the rate of movement of the pusher supporting body. Since it is possible to quickly grip the semiconductor process wafer while preventing the semiconductor process wafer from damage, this makes it possible to improve the rate of production of the semiconductor process wafer while accomplishing improvement in yield of the semiconductor process wafer.

In addition, in accordance with the above configuration, the buffering member is inserted through the guiding groove, thereby suppressing the plastic deforming of the buffering member. This reduces the difference due to the presence or absence of a plastic deformation of the buffering member, with regard to the distance for which the pusher supporting body is moved when gripping the semiconductor process wafer. And it becomes possible to further shorten the moving distance of the pusher supporting body to be secured. This makes it possible to make the pressing mechanism compact.

In the foregoing invention, it is preferable that the buffering member is disposed on a side of the clamp member of the pusher supporting portion.

According to the above configuration, it becomes possible to reduce the mass of a construction interposed between the substrate and the buffering member whereby the shock occurring to the shock member can be diminished. Therefore, even the shock member having a small outside dimension can suitably absorb the impact occurring to the semiconductor process wafer. This can make the pressing mechanism compact.

In the above invention, it is preferable that the pusher supporting portion has a supporting main body movable in the pressing direction and a supporting member disposed in the supporting main body, that the pusher is disposed in the supporting member and that the supporting member is formed such that the supporting member elastically deforms in a direction opposite to the pressing direction by the pressing.

In accordance with the above configuration, when the pusher presses the semiconductor process wafer, the supporting member elastically deforms in a direction opposite to the pressing direction to absorb the force with which the pusher presses the semiconductor process wafer. This makes it possible to cushion the shock occurring between the pusher and the semiconductor process wafer whereby the semiconductor process wafer is prevented from damage.

The present invention provides a robot including any one of the foregoing edge gripping apparatuses.

In accordance with the above configuration, it becomes possible to realize a robot capable of accomplishing the operation/working-effect.

DETAILED DESCRIPTION OF INVENTION

Hereinafter, referring to FIGS. 1-6, a description will be made with regard to a transfer robot 2 including a chuck hand 1 as one embodiment of an edge grip device according to the present invention. The chuck hand 1 and the transfer robot 2 will be hereinafter described, but they are to be understood as no more than examples. Accordingly, the present invention is not limited to the manner of embodiment and, therefore, additions, omissions and modifications may be made unless departing from the scope of the present invention.

Configuration of Transfer Robot

The transfer robot 2 is a robot capable of transporting a semiconductor process wafer and is provided, for example, in semiconductor processing equipment. In the present invention, the semiconductor process wafer is a thin plate used in a semiconductor process and is defined as the material for a semiconductor device substrate. The semiconductor process wafer includes, for example, a semiconductor wafer, a glass wafer, a sapphire wafer (single crystal alumina) and so on. The semiconductor wafer includes, for example, a silicon wafer, a wafer of semiconductor simple substance other than silicon, a wafer of compound semiconductor and so on. The glass wafer includes, for example, an FPD (Flat Panel Display) glass substrate, an MEMS (Micro Electro Mechanical Systems) glass substrate and so on.

The semiconductor processing equipment is provided with semiconductor processing apparatuses (not shown) for performing their respective process treatments such as a heat treatment, an impurity introducing treatment, a thin film forming treatment, a lithography treatment, a washing treatment, a planarization treatment and so on. The transfer robot 2 is configured such that it takes a semiconductor process wafer 3 housed in a hoop (not shown) and then transports it to a predetermined housing location in each semiconductor processing apparatus. In addition, the transfer robot 2 is configured such that it takes a semiconductor process wafer 3 placed at a predetermined housing location in each semiconductor processing apparatus and then transports it to another semiconductor processing apparatus.

Figure 1:
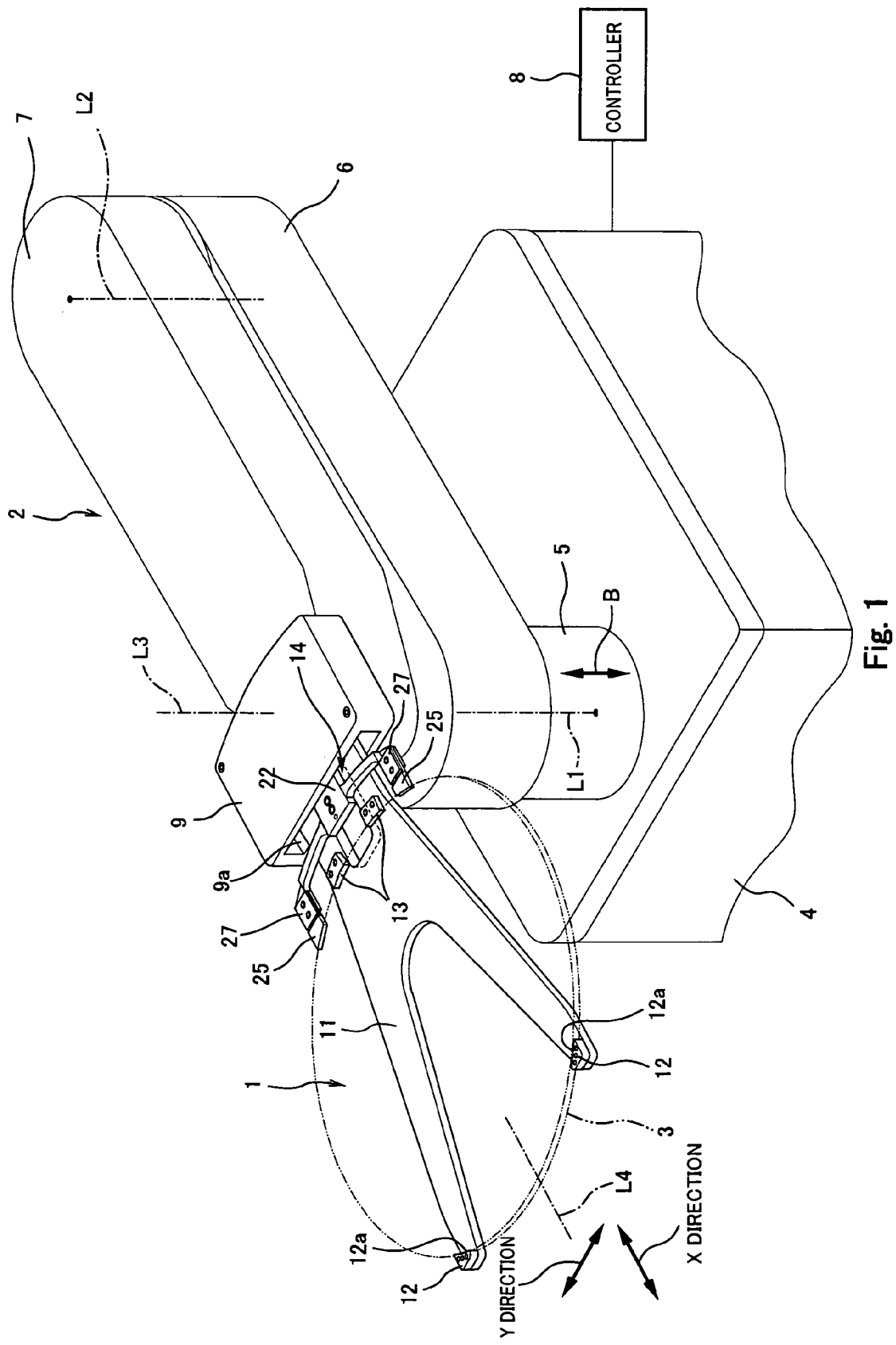
FIG. 1 is a perspective view illustrating a transfer robot including a chuck hand serving as an edge grip device according to one embodiment of the present invention.

As shown in FIG. 1, the transfer robot 2 is a triaxial robot of the so-called horizontal articulated robot and has a base platform 4 firmly fixed to a semiconductor processing equipment casing. The base platform 4 is provided with an elevating shaft 5 which elongates and contracts in an up and down direction (indicated by arrow B of FIG. 1). The elevating shaft 5 is configured such that it can elongate and contract by an air cylinder (not shown) or the like. A first arm 6 is mounted to an upper end of the elevating shaft 5 capable of elongation and contraction.

The first arm 6 is an elongate member extending in a horizontal direction and one of its longitudinal ends is attached to the elevating shaft 5 so as to be able to rotate around a vertical axis line L1. The first arm 6 is configured such that it can be rotationally driven by an electric motor (not shown). In addition, a second arm 7 is attached to the other longitudinal end of the first arm 6.

The second arm 7 is also an elongate member extending in a horizontal direction and one of its longitudinal ends is attached to the first arm 6 so as to be able to rotate around a vertical axis line L2. The second arm 7 is configured such that it can be rotationally driven by an electric motor (not shown). The chuck hand 1 is attached to the other longitudinal end of the second arm 7 so as to be able to rotate around a vertical axis line L3. The chuck hand 1 is configured such that it can be rotationally driven by an electric motor (not shown). A controller 8 to be hereinafter described controls the moving up and down of the elevating shaft 5, the rotation of the first arm 6, the rotation of the second arm 7 and the rotation of the chuck hand 1.

Configuration of Chuck Hand

Figure 2:
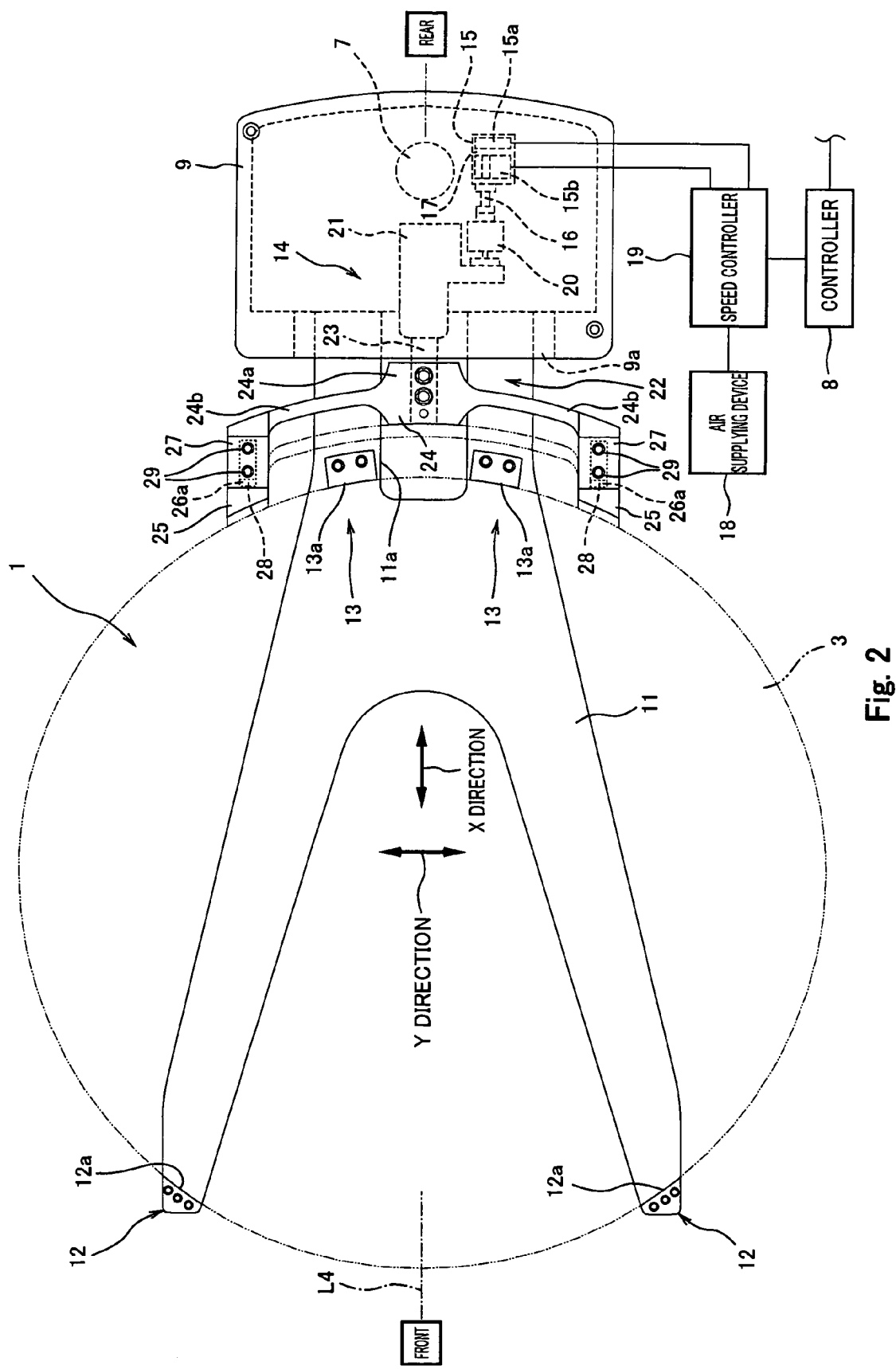
FIG. 2 is an enlarged top plan view illustrating in an enlarged manner the chuck hand of FIG. 1.
Figure 3:
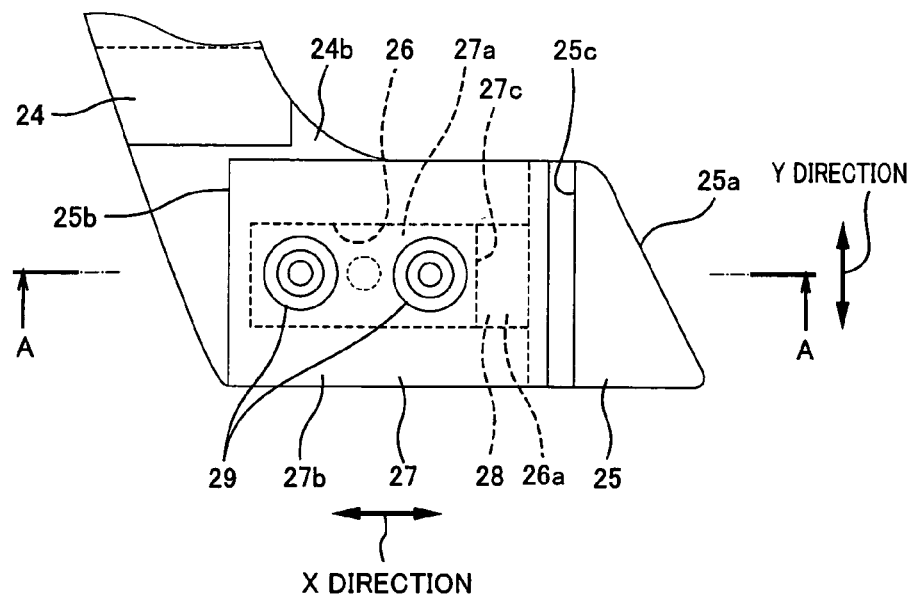
FIG. 3 is an enlarged top plan view illustrating in an enlarged manner the periphery of a pusher of the chuck hand of FIG. 2.
Figure 4:
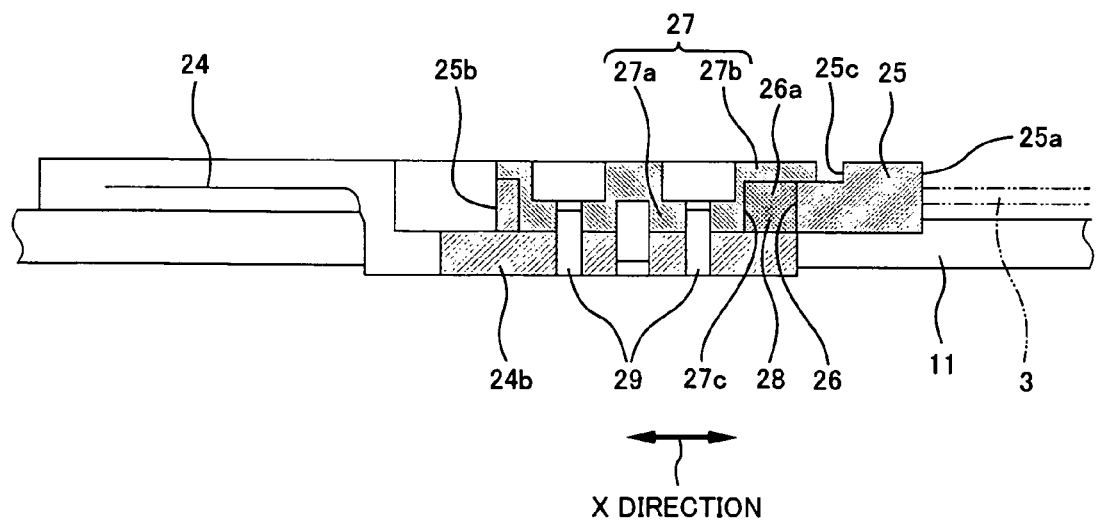
FIG. 4 is a cross sectional view sectioned along section line A-A illustrating the chuck hand shown in FIG. 3.

The chuck hand 1 serving as an edge grip device is configured such that it can grip and hold the semiconductor process wafer 3. The chuck hand 1 has a casing 9, as shown in FIG. 2. The casing 9 is a hollow box and has a generally rectangular shape in plan view. An underside of the casing 9 is attached to the second arm 7. In addition, the casing 9 has at one of its sides an opening. Inserted into this opening is a hand main body 11. The hand main body 11 inserted through the opening is firmly fixed to an opening end 9a of the casing 9.

The hand main body 11 splits in two on its distal end and is configured so as to have a Y-shape in plan view. The proximal end of the hand main body 11 is firmly fixed to the opening end 9a of the casing 9. In addition, each of the two bifurcated end portions of the hand main body 11 is provided with a front guide 12. Besides, a pair of rear guides 13, 13 are disposed on the side of the proximal end of the hand main body 11 so that they lie face to face with the one pair of the front guides 12, 12, respectively. Furthermore, formed on the side of the proximal end of the hand main body 11 is a guiding groove 11a extending along a central line L4 of the hand main body 11. The guiding groove 11a is, for example, in the form of a long through hole and is formed between the one pair of the rear guides 13, 13. The one pair of the front guides 12, 12 and the one pair of the rear guides 13, 13 serve to support the semiconductor process wafer 3. To this end, these front and rear guides are located and shaped so as to fit the shape of the semiconductor process wafer 3, thereby making it possible to suitably support the semiconductor process wafer 3. Although the semiconductor process wafer 3 can be in any shape, an example is shown in the following in which example the semiconductor process wafer 3 has a circular shape.

Each front guide 12 serving as a clamp member extends upward. The front guide 12 has an opposing surface 12a. The opposing surface 12a faces in the direction of the proximal end of the hand main body 11 and is curved into a circular arc to the shape of the edge of the semiconductor process wafer 3. In addition, each rear guide 13 likewise extends upward. The rear guide 13 has an opposing surface 13a. The opposing surface 13a faces in the direction of the distal end of the hand main body 11 and is curved into a circular arc to the shape of the edge of the semiconductor process wafer 3. The semiconductor process wafer 3 to be gripped is placed between the one pair of the front guides 12, 12 curved as above described and the one pair of the rear guides 13, 13 curved as above described, and is supported on the hand main body 11.

The one pair of the front guides 12, 12 formed as above described and the one pair of the rear guides 13, 13 formed as above described are configured such that, when the semiconductor process wafer 3 to be placed between the one pair of the front guides 12, 12 and the one pair of the rear guides 13, 13 abuts against one of the front and rear guides 12 and 13, the semiconductor process wafer 3 will never abut against the other of the front and rear guides 12, 13. Stated another way, it is arranged such that, when the edge of the semiconductor process wafer 3 is in abutment with the one pair of the front guides 12, 12, the edge of the semiconductor process wafer 3 will never abut against the one pair of the rear guides 13, 13. However, there is the case where the edge of the semiconductor process wafer 3 may abut against both the one pair of the front guides 12, 12 and the one pair of the rear guides 13, 13, depending on the processing accuracy and the location accuracy of the front and rear guides 12 and 13 as well as on the processing accuracy of the semiconductor process wafer 3.

Additionally, a pressing mechanism 14 is disposed within the casing 9. The pressing mechanism 14 is for pressing the semiconductor process wafer 3 on the upper surface of the hand main body 11 against the one pair of the front guides 12, 12, whereby the semiconductor process wafer 3 is gripped. The pressing mechanism 14 has a cylinder 15. The cylinder 15 is disposed within the casing 9. A rod 16 is advanceably and retractably inserted into the cylinder 15. A piston 17 is provided at one end of the rod 16. The piston 17 divides the space in the cylinder 15 into two spaces, namely a first space 15a and a second space 15b. An air supplying apparatus 18 such as an air compressor is connected to the first space 15a and to the second space 15b. In addition, a speed controller 19 is placed between the air supplying apparatus 18 and the cylinder 15.

The speed controller 19 is provided with a flow directional control valve. The speed controller 19 is configured such that the destination to which the supply of air is provided is selected between the first space 15a and the second space 15b. In addition, the speed controller 19 can control the supply pressure of air to be supplied. The speed controller 19 thus configured is under control of a controller 8 to be hereinafter described. That is, the speed controller 19 is configured such that the destination to which the supply of air is provided is selectively switched to the first space 15a or to the second space 15b in response to an instruction from the controller 8. It is arranged such that, when the speed controller 19 switches the destination to which the supply of air is provided to the first space 15a, the rod 16 moves forward while, when the speed controller 19 switches the destination to which the supply of air is provided to the second space 15b, the rod 16 moves backward.

A linear movable body 21 is attached through a universal joint 20 to a distal end of the rod 16 which is configured to advance and retract in the manner as described above. The linear movable body 21 is disposed within the casing 9. The linear movable body 21 is configured such that it moves back and forth along the central line L4 of the hand main body 11 according to the advance movement and the retreat movement of the rod 16. In other words, the linear movable body 21 is configured such that it can make linear reciprocating motion of moving toward or away from the opening of the casing 9. A pusher supporting body 22 is firmly fixed to the opening-side end of the linear movable body 21 thus configured.

The pusher supporting body 22 is generally T-shaped in plan view. The pusher supporting body 22 has a supporting main body 23 and a supporting member 24. The supporting main body 23 is slidably engaged and inserted into the guiding groove 11a of the hand main body 11. And, the supporting main body 23 is firmly fixed, at its proximal end, to the linear movable body 21. This allows the supporting main body 23 to slide back and forth along the central line L4 of the hand main body 11 as the linear movable body 21 moves backward and forward. The distal end side of the supporting main body 23 projects from the opening of the casing 9. The supporting member 24 is disposed on the distal end side of the supporting main body 23. The supporting member 24 is a member which formed into a generally circular arc shape in plan view. The supporting member 24 has a main body portion 24a and a pair of supporting portions 24b. The main body portion 24a is firmly fixed to the supporting main body 23. The one pair of the supporting portions 24b are provided in the main body portion 24a. The one pair of the supporting portions 24b extend from the main body portion 24a to both the crosswise sides of the hand main body 11, respectively and are configured in the form of a cantilever. Each supporting portion 24b has at its distal end portion a pusher 25. Hereinafter, a description will be made with making reference to FIG. 3 as well as to FIG. 4.

The pusher 25 is a plate-like member made of synthetic resin material. A distal end surface of the pusher 25 is curved into a circular arc so as to fit the shape of the edge of the semiconductor process wafer 3. A step 25c is formed in an upper surface of the pusher 25 wherein the side of a proximal end 25b is formed at a level lower than the side of a distal end surface 25a. Furthermore, a guiding groove 26 passing completely through in a thick direction is formed on the side of the proximal end 25b of the upper surface of the pusher 25. The guiding groove 26 has a rectangular shape in plan view and extends in a direction in parallel with the central line L4 (hereinafter, referred to just as the "X direction").

The pusher 25 having the aforesaid guiding groove 26 is placed at a distal end portion of the supporting portion 24b with its upper surface facing up. In addition, the pusher 25 is arranged so that its distal end surface 25a is located face to face with the one pair of the front guides 12. For the attachment of the pusher 25 thus arranged, the pusher supporting body 22 has a guiding member 27. The pusher 25 is fitted to the guiding member 27 in such a manner that the guiding member 27 is inserted through the guiding groove 26.

The guiding member 27 is disposed in a standing manner at a distal end portion of the supporting portion 24b. The guiding member 27 has a guiding portion 27a and a covering plate 27b. The guiding portion 27a is formed into a generally rectangular parallelepiped shape and extends in the X direction. The width of the guiding portion 27a (i.e., the length in the Y direction perpendicular to the X direction) substantially conforms to the width of the guiding groove 26. In addition, the X direction length of the guiding portion 27a is shorter than the X direction length of the guiding groove 26. The guiding portion 27a having such a shape is inserted through the guiding groove 26. The pusher 25 is configured such that it is guided in the guiding groove 26 by the guiding portion 27a to thereby be able to slide in the X direction with respect to the supporting portion 24b (the pusher supporting body 22). In other words, with respect to the pusher 25, the guiding portion 27a relatively slides in the X direction in the guiding groove 26. The guiding portion 27a which guides the pusher 25 to slide in this way is located at the rearmost side of the guiding groove 26. This defines a gap 26a in front of the guiding portion 27a (relative to the pressing direction). And, a buffering member 28 is fitted into the gap 26a. Because of this, the buffering member 28 is placed between the pusher supporting body 22 and the pusher 25.

The buffering member 28 is made of material having a low bounce such as rubber, low rebound material, or other like material and is formed into a rectangular parallelepiped shape. When the guiding portion 27a slides in the X direction in the guiding groove 26, the buffering member 28 is crushed to elastically deform, thereby cushioning the collision between the guiding portion 27a and the pusher 25. The buffering member 28 is arranged in the gap 26a of the guiding groove 26 so as to abut against a distal end surface 27c which is a surface on the side of the distal end of the guiding portion 27a. The buffering member 28 thus arranged fills up the gap 26a of the guiding groove 26.

The buffering member 28 thus configured is configured so as not to, in effect, elastically deform even if the guiding portion 27a pushes the pusher 25 via the buffering member 28 when the distal end surface 25a of the pusher 25 is not being in abutment with the semiconductor process wafer 3 or the like. Stated another way, the buffering member 28 is configured such that, when the distal end surface 25a of the pusher 25 is not being in abutment with the semiconductor process wafer 3 or the like, the guiding portion 27a can push the pusher 25 without the absorption of force. On the other hand, the buffering member 28 is configured such that, when the guiding portion 27a pushes the pusher 25 via the buffering member 28 at the time that the distal end surface 25a of the pusher 25 is being in abutment with the semiconductor process wafer 3 or the like, the buffering member 28 undergoes an elastic deform. That is to say, the buffering member 28 is configured so as to absorb and suppress the force with which the guiding portion 27a pushes the pusher 25 at the time that the distal end surface 25a of the pusher 25 is being in abutment with the semiconductor process wafer 3 or the like.

The guiding portion 27a with the buffering member 28 placed between itself and the pusher 25 is arranged on the distal end portion of the supporting portion 24b so as to abut, at its underside, with the distal end portion. The covering plate 27b is disposed, in an integral manner, in the upper surface of the guiding portion 27a. The width of the covering plate 27b substantially conforms to the width of the pusher 25. In addition, the X direction length of the covering plate 27b is shorter than the distance from the proximal end of the pusher 25 to the step 25c. The covering plate 27b having such a shape is arranged so as to cover the proximal end side of the upper surface of the pusher 25. In such a configuration, the covering plate 27b is configured to close off an upper side opening of the guiding groove 26, thereby preventing the buffering member 28 from jumping out of the upper side opening. In addition, the distal end surface of the covering plate 27b is spaced away from the step 25c in the X direction. This configures the pusher 25 to be able to slide with respect to the guiding portion 27a. Furthermore, the distal end surface of the covering plate 27b is configured so as to abut against the step 25c if the pusher 25 is pushed back a predetermined distance. That is, the covering plate 27b constitutes, along with the step 27c, a stopper.

The guiding member 27 thus configured is fastened by bolts 29, 29 to the distal end portion of the supporting portion 24b and is firmly fixed to the distal end portion of the supporting portion 24b. Because of this, the pusher 25 is placed between the distal end portion of the supporting portion 24b and the covering plate 27b and is configured so as not to become loose from the pusher supporting body 22. Additionally, the pusher 25 is arranged so as to lie face to face with the front guide 12. By such arrangement of the pusher 25, the pusher 25 is configured so as to abut and press against the semiconductor process wafer 3 when the pusher supporting body 22 is moved forward. In addition, the pusher 25 is configured such that, when pressed against the semiconductor process wafer 3, the pusher 25 pushes the semiconductor process wafer 3 in the direction of the front guide 12 so as to grip, along with the front guide 12, the semiconductor process wafer 3.

The transfer robot 2 with the pressing mechanism 14 configured as above described includes the controller 8. The controller 8 is connected to the switching valve for switching the flow of air to the air cylinder (not shown) which is configured to elongate and contract the elevating shaft 5, and to the electric motors (not shown) for rotating the first arm 6, the second arm 7 and the chuck hand 1, respectively. The controller 8 is configured such that, based on the predetermined programs, it controls the switching valve and each of the electric motors. In addition, the controller 8 is connected to the speed controller 19. The controller 8 is configured such that it can control the speed controller 19 to switch the destination to which the supply of air is provided and, in addition, to change the supply pressure of air.

In the transfer robot 2 having the controller 8 as above described, the controller 8 controls the elongation and contraction of the elevating shaft 5 and the rotation of the first arm 6, the second arm 7 and the chuck hand 1 so that the chuck hand 1 is shifted to desired positions, and the controller 8 further controls the destination to which the supply of air is provided so that the semiconductor process wafer 3 is gripped by the chuck hand 1 and so that the semiconductor process wafer 3 gripped is released. In the following, a description will be made with regard to the steps of a procedure of gripping and then transporting the semiconductor process wafer 3 by means of the chuck hand 1.

Gripping and Transporting of Semiconductor Process Wafer

In the first place, the controller 8 provides control for the elevating shaft 5, the first arm 6, the second arm 7 and the chuck hand 1 to move so that the chuck hand 1 will lie under the semiconductor process wafer 3. In doing so, the controller 8 controls the movement of the elevating shaft 5, the first arm 6, the second arm 7 and the chuck hand 1 so that, when placing the semiconductor process wafer 3 on the hand main body 12 in a step to be hereinafter described, the semiconductor process wafer 3 is placed between the one pair of the front guides 12, 12 and the one pair of the rear guides 13, 13. When the chuck hand 1 is placed under the semiconductor process wafer 3, the controller 8 provides control for the elevating shaft 5 to elongate to thereby move the chuck hand 1 upward. As a result, the semiconductor process wafer 3 comes to lie between the one pair of the front guides 12, 12 and the one pair of the rear guides 13, 13 and is loaded on the hand main body 11.

After the loading of the semiconductor process wafer 3 onto the hand main body 1, the controller 8 provides control for the speed controller 19 to switch the destination to which the supply of air is provided to the first space 15a to thereby cause the rod 16 to move forward. With the advancement of the rod 16, the linear movable body 21 is pushed, moving forward. With the advancement of the linear movable body 21, the pusher supporting body 22 moves forward along the central line L4. In other words, the pusher supporting body 22 moves in the direction of the semiconductor process wafer 3. As the pusher supporting body 22 moves, it pushes forward the one pair of the pushers 25, 25 through the buffering member 28. As a result of this, the pusher 25 moves forward in the direction of the semiconductor process wafer 3. The distal end surface 25a of each of the one pair of the pushers 25, 25 on the forward move abuts against the edge of the semiconductor process wafer 3 and is pressed against the semiconductor process wafer 3.

Figure 5:
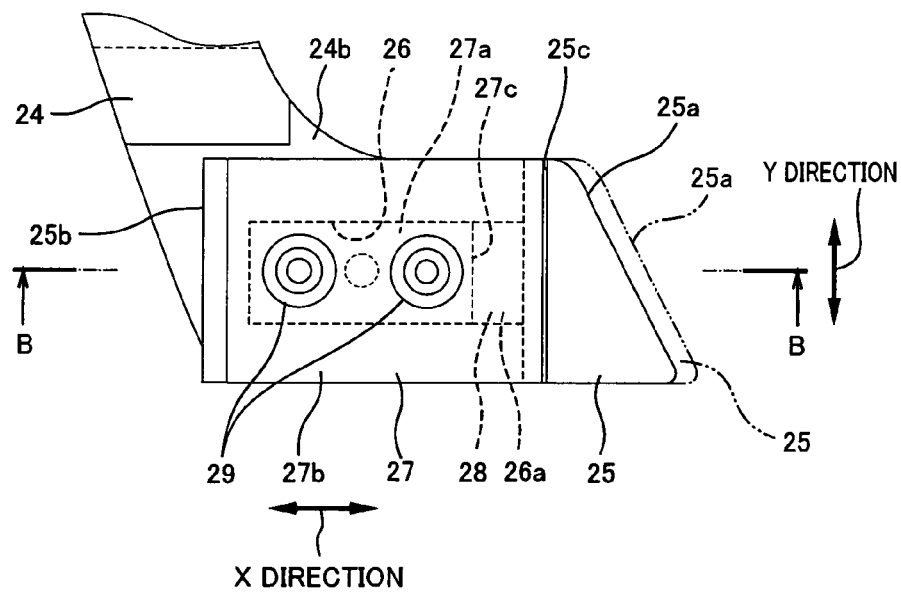
FIG. 5, comprised of FIG. 5(*a*) and FIG. 5(*b*), is a diagram illustrating in an enlarged manner a part of a chuck hand 1 gripping a semiconductor process wafer wherein FIG. 5(*a*) is an enlarged top plan view illustrating in an enlarged manner the periphery of a pusher and FIG. 5(*b*) is a cross sectional view sectioned along section line B-B illustrating a part of the chuck hand shown in FIG. 5(*a*).
Figure 5:
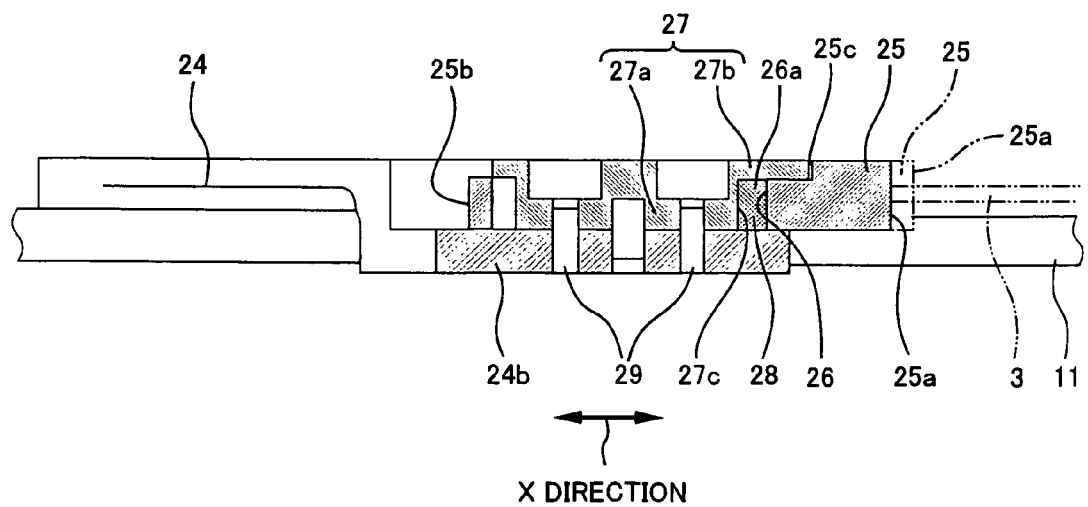

When, in this case, the pusher 25 abuts and stops against the edge of the semiconductor process wafer 3, the guiding portion 27a pushes the buffering member 28 while elastically deforming it and, at the same time, slides in the guiding groove 26 (solid line of FIG. 5), as shown in FIG. 5. The guiding portion 27a slides while it elastically deforms the buffering member 28 whereby the force with which the guiding portion 27a pushes the pusher 25 is absorbed by the buffering member 28. Therefore, the force, applied to the edge of the semiconductor process wafer 3 at the moment when the pusher 25 abuts against the edge of the semiconductor process wafer 3, can be suppressed. In other words, it becomes possible to reduce the shock occurring between the pusher 25 and the semiconductor process wafer 3.

In addition, the supporting portion 24b stretches from the main body portion 24a in the form of a beam, so that the supporting portion 24b is elastically deformed backward upon abutment of the pusher 25 with the semiconductor process wafer 3. As a result of such elastic deformation, the force with which the pusher supporting body 22 pushes the pusher 25 is absorbed. This makes it possible to control the force applied to the edge of the semiconductor process wafer 3 at the moment when the pusher 25 abuts against the semiconductor process wafer 3. To sum up, it becomes possible for the supporting portion 24b to reduce the shock occurring between the pusher 25 and the semiconductor process wafer 3.

While the shock occurring between the pusher 25 and the semiconductor process wafer 3 is being reduced, the pusher 25 is abutted and pressed against the semiconductor process wafer 3 by the pusher supporting body 22. Having being pressed, the pusher 25 pushes the semiconductor process wafer 3 in the direction of the one pair of the front guides 12, 12 (i.e., in the forward direction) and grips, along with the one pair of the front guides 12, the semiconductor process wafer 3. After the gripping of the semiconductor process wafer 3, the controller 8 provides control so that the semiconductor process wafer 3 is moved upward to reach a predetermined position.

When the semiconductor process wafer 3 is transported to the upward predetermined position, the controller 8 provides control for the speed controller 19 to switch the destination to which the supply of air is provided to the second space 15b to thereby cause the rod 16 to move backward. With the retreat of the rod 16, the linear movable body 21 and the pusher supporting body 22 are pulled back and the pusher supporting body 22 retreats. As the pusher supporting body 22 moves backward, the one pair of the pushers 25, 25 are pushed backward by the pusher supporting body 22 and are moved backward. In this case, it is not until the strain of the buffering member 28 due to elastic deformation disappears that the pusher 25 starts retreating. Therefore, the pusher 25 starts retreating with a delay to the retreat of the pusher supporting body 22. As the one pair of the pushers 25, 25 retreat, they become separated from the semiconductor process wafer 3. Thereby, the semiconductor process wafer 3 gripped is released.

After the semiconductor process wafer 3 becomes loose, the controller 8 provides control for the elevating shaft 5 to contract to thereby lower the chuck hand 1 so that the semiconductor process wafer 3 is placed at a predetermined position. In this way, it becomes possible to take the semiconductor process wafer 3 housed at a predetermined position in the hoop or the like to another predetermined position within a semiconductor processing apparatus or the like.

Shock Occurring to Semiconductor Process Wafer

Figure 6:
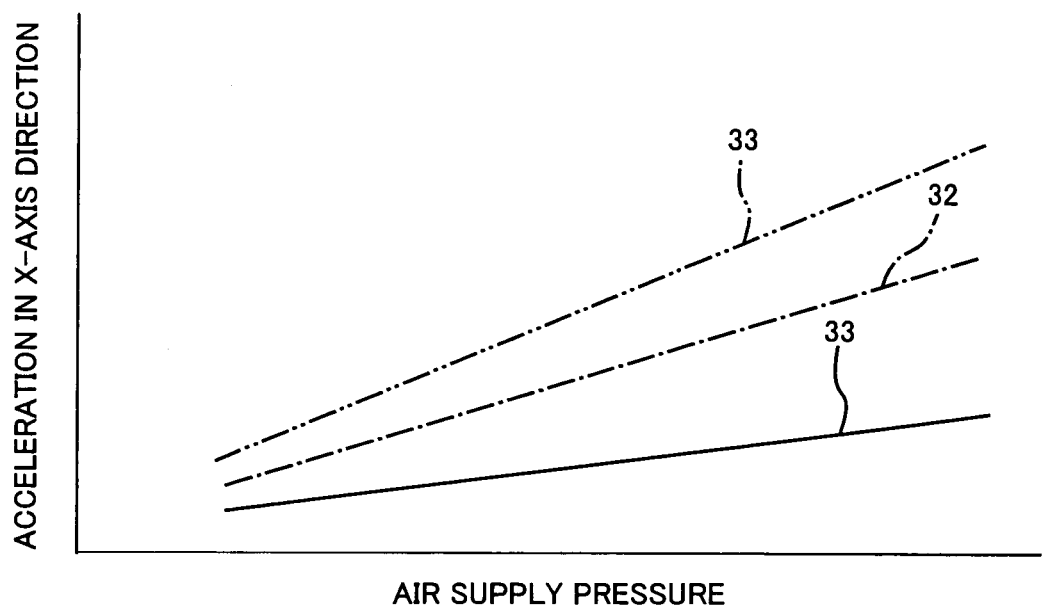
FIG. 6 is a graph showing the relationship between the shock occurring to a semiconductor process wafer and the supply pressure of air.

In the following, referring to FIG. 6, a description will be made with regard to the shock occurring when gripping the semiconductor process wafer 3. FIG. 6 is a graph representing the relationship between the shock (X direction acceleration) occurring between the pusher 25 and the semiconductor process wafer 3 and the supply pressure of air to the cylinder 15. In FIG. 6, the horizontal axis indicates the supply pressure of air and the vertical axis indicates the X direction acceleration, i.e., the shock. In addition, in FIG. 6, a solid line 31 represents the shock occurring to the semiconductor process wafer 3 in the chuck hand 1. In addition, an alternate long and short dash line 32 represents the shock occurring to the semiconductor process wafer 3 in the case where there is no interposition of the buffering member 28 in the chuck hand 1. Furthermore, an alternate long and two short dashes line 33 represents the shock occurring to the semiconductor process wafer 3 in the case where a prior art substrate holding apparatus is used.

In the chuck hand 1 and the prior art substrate holding apparatus, both the hand main body 11 and the substrate holding portion increase in extrusion load in response to the rise in the supply pressure of air. This is obvious from the fact that all of the solid line 31, the alternate long and short dash line 32 and the alternate long and two short dashes line 33 steadily grow, and also from the fact that the shock increases in response to the increase in the supply pressure of air, as shown in FIG. 6. The moving speed of the pusher supporting body 22 increases according to the supply pressure of air to the cylinder 15. That is, FIG. 6 shows that the above mentioned shock increases according to the moving speed of the pusher supporting body 22.

The comparison among the solid line 31, the alternate long and short dash line 32 and the alternate long and two short dashes line 33 shows that, in the solid line 32, the shock occurring between the pusher 25 and the semiconductor process wafer 3 is reduced to about two thirds relative to the alternate long and short dash line 32. Stated another way, the supporting portion 24b is elastically deformed in the backward direction when the pusher 25 abuts against the edge of the semiconductor process wafer 3, thereby reducing the shock occurring between the pusher 25 and the semiconductor process wafer 3 to about two thirds.

In addition, in the solid line 31, the shock is reduced to about half relative to the alternate long and short dash line 32, and to about one thirds relative to the alternate long and two short dashes line 33. That is, the interposition of the buffering member 28 between the pusher supporting body 22 and the pusher 25 reduces the shock occurring between the pusher 25 and the semiconductor process wafer 3 to about half. In addition, owing to the combination of the supporting portion 24b and the buffering member 28, the shock occurring to the semiconductor process wafer 3 is reduced to about one thirds as compared to the prior art substrate holding apparatus.

In this way, the chuck hand 1 can diminish the shock occurring between the pusher 25 and the semiconductor process wafer 3 even if the supply pressure of air is increased to thereby increase the moving speed of the push supporting body 22. Accordingly, in the chuck hand 1, the semiconductor process wafer 3 will not be damaged even if the moving speed of the pusher supporting body 22 is increased. This makes it possible for the chuck hand 1 to quickly grip the semiconductor process wafer 3 by increasing the moving speed of the pusher supporting body 22. In this way, the chuck hand 1 can quickly grip the semiconductor process wafer 3 while preventing the semiconductor process wafer 3 from damage, thereby improving the rate of production while achieving improvement in yield of the semiconductor process wafer 3.

In addition, in the chuck hand 1, the buffering member 28 for reducing the shock between the semiconductor process wafer 3 and the pusher 25 is arranged between the pusher supporting body 22 and the pusher 25. Since the buffering member 28 is made of material having a low bounce such as rubber, low rebound material, or other like material, this allows the buffering member 28 to absorb shock without damping, unlike a spring. Therefore, after gripping the semiconductor process wafer 3, the chuck hand 1 is able to quickly move the gripped semiconductor process wafer 3 without having to wait for damping to subside as in the prior art technique. Therefore, the employment of the chuck hand 1 improves the rate of production of the semiconductor process wafer 3.

In addition, in the chuck hand 1, the buffering member 28 is inserted through the guiding groove 11a, thereby controlling the plastic deforming of the buffering member 28. This diminishes the difference due to the presence or absence of a plastic deformation in the buffering member 28, with regard to the distance for which the pusher supporting body 22 is moved when gripping the semiconductor process wafer 3. And, the minimum distance for which the pusher supporting body 22 has to be moved can be made shorter. This makes it possible to make the cylinder 15, the rod 16 and so on compact in configuration. That is, the pressing mechanism 14 itself can be made compact. In addition, how much the rod 16 has been elongated or contracted is detected by a sensor (not shown) and, based on the detection value from the sensor, the advancement or the retraction of the rod 16 is detected, but if the plastic deformation is large, there is the possibility that the sensor may malfunction. It is preferable to use a low rebound material which is less prone to plastic deformation than rubber.

The chuck hand 1 is configured such that the two pushers 25 grip the semiconductor process wafer 3, thereby making it possible to disperse the shock occurring between the pusher 25 and the semiconductor process wafer 3. This makes it possible for the chuck hand 1 to prevent occurrence of a severe shock at a local portion of the semiconductor process wafer 3, thereby making it possible to prevent the semiconductor process wafer 3 from damage when gripped.

Furthermore, in the chuck hand 1, the buffering member 28 is disposed on the distal end side of the pusher supporting body 22 and is arranged so as to abut against the pusher 25. Therefore, only the pusher 25 lies between the semiconductor process wafer 3 and the buffering member 28. The pusher 25 is small in mass, thereby making it possible to diminish the shock occurring to the buffering member 28. Therefore, even the buffering member 28 having a small outside diameter dimension can sufficiently absorb the shock occurring to the semiconductor process wafer 3. This can make the pressing mechanism 14 compact.

In the present embodiment, the target that the chuck hand 1 intends to hold is the semiconductor process wafer 3, but the target to be held may be other than the semiconductor process wafer 3 and therefore may be a glass wafer, a sapphire wafer and so on or any other type of semiconductor process wafer. In addition, in the chuck hand 1, the semiconductor process wafer 3 is pushed by the two pushers 25. However, it may be arranged such that the pusher supporting body 22 is provided with three pushers 25 wherein the semiconductor process wafer 3 is pushed by these three pushers 25. Conversely, it may be arranged such that the pusher supporting body 22 is provided with only a single pusher 25.

The invention claimed is:

1. An edge grip device comprising:
 a clamp member; and
 a pressing mechanism, the pressing mechanism including a pusher which is disposed so as to face the clamp member and which is configured to press a semiconductor process wafer against the clamp member to thereby grip, along with the clamp member, the semiconductor process wafer,
 the pressing mechanism further including:
 a pusher supporting body having a supporting member which supports the pusher in a relatively movable manner and a guiding portion which guides the pusher moving relative to the supporting member in a pressing direction in which pressing is applied, the pusher supporting body being movable in the pressing direction and having a gap between the guiding portion and the pusher in the pressing direction; and
 a buffering member which is arranged in the gap between the pusher and the guiding portion, the buffering member having a low bounce and being elastically deformable, wherein
 when the guiding portion moves in the pressing direction, the guiding portion pushes the pusher through the buffering member to thereby move the pusher in the pressing direction whereby the semiconductor process wafer is pressed against the clamp member.

2. The edge grip device as set forth in claim 1, wherein:
 the guiding portion movably guides the pusher in a direction opposite to the pressing direction;
 the pusher has a guiding groove which fits with the guiding portion in a relatively movable manner in the pressing direction and which is longer than the guiding portion in the pressing direction; and
 the buffering member is inserted in the guiding groove such that the buffering member is located forward relative to the guiding portion in the pressing direction and undergoes an elastic deformation when relatively pressed by the guiding portion.

3. The edge grip device as set forth in claim 1, wherein the buffering member is disposed on a side of the clamp member of the supporting member.

4. The edge grip device as set forth in claim 1, wherein:
 the pusher supporting body has a supporting main body movable in the pressing direction;
 the supporting member is disposed in the supporting main body so as to extend in a crosswise direction crossing the pressing direction, and is formed such that the supporting member elastically deforms in a direction opposite to the pressing direction by the pressing; and
 a plurality of the pushers are disposed in the supporting member so as to be spaced apart from each other in the crosswise direction.

5. A robot which comprises the edge grip device as set forth in claim 1.

* * * * *